(12) United States Patent  
Cai et al.

(10) Patent No.: US 9,379,028 B2  
(45) Date of Patent: Jun. 28, 2016

(54) SOI CMOS STRUCTURE HAVING PROGRAMMABLE FLOATING BACKPLATE

(75) Inventors: Jin Cai, Yorktown Heights, NY (US); Robert H. Dennard, Yorktown Heights, NY (US); Ali Khakifirooz, Albany, NY (US); Tak H. Ning, Yorktown Heights, NY (US); Jeng-Bang Yau, Yorktown Heights, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 930 days.

(21) Appl. No.: 12/619,285

(22) Filed: Nov. 16, 2009

(65) Prior Publication Data

US 2011/0115553 A1 May 19, 2011

(51) Int. Cl.
| | |
|---|---|
| H01L 29/94 | (2006.01) |
| H01L 21/84 | (2006.01) |
| H01L 29/78 | (2006.01) |
| H01L 27/12 | (2006.01) |

(52) U.S. Cl.  
CPC .......... *H01L 21/84* (2013.01); *H01L 27/1203* (2013.01); *H01L 29/7841* (2013.01)

(58) Field of Classification Search  
CPC ................ H01L 27/1203; H01L 29/7841  
USPC .................................................. 257/314, 347  
See application file for complete search history.

(56) References Cited

U.S. PATENT DOCUMENTS

| | | | |
|---|---|---|---|
| 5,488,243 A | 1/1996 | Tsuruta et al. | |
| 5,747,847 A | 5/1998 | Morinaka et al. | |
| 6,548,848 B2 * | 4/2003 | Horiguchi et al. | 257/296 |
| 2002/0043693 A1 | 4/2002 | Tiwari et al. | |
| 2003/0209752 A1 | 11/2003 | Cai et al. | |
| 2008/0237689 A1 | 10/2008 | Kitano | |
| 2009/0108355 A1 | 4/2009 | Cai et al. | |

FOREIGN PATENT DOCUMENTS

JP 200512018 A 1/2005

OTHER PUBLICATIONS

International Search Report dated Jan. 25, 2011 received in corresponding foreign application.

* cited by examiner

*Primary Examiner* — Howard Weiss  
*Assistant Examiner* — Tifney Skyles  
(74) *Attorney, Agent, or Firm* — Scully, Scott, Murphy & Presser, P.C.

(57) ABSTRACT

SOI CMOS structures having at least one programmable electrically floating backplate are provided. Each electrically floating backplate is individually programmable. Programming can be performed by injecting electrons into each conductive floating backplate. Erasure of the programming can be accomplished by tunneling the electrons out of the floating backplate. At least one of two means can accomplish programming of the electrically floating backgate. The two means include Fowler-Nordheim tunneling, and hot electron injection using an SOI pFET. Hot electron injection using pFET can be done at much lower voltage than injection by tunneling electron injection.

12 Claims, 7 Drawing Sheets

SOI CMOS STRUCTURE HAVING PROGRAMMABLE FLOATING BACKPLATE

BACKGROUND

The present invention relates to semiconductor structures, and particularly to semiconductor structures including semiconductor devices having a programmable floating backplate, methods of manufacturing the same, and methods of operating the same.

In semiconductor-on-insulator (SOI) complementary metal-oxide-semiconductor (CMOS) circuits, a conductive region can be provided underneath a buried oxide (BOX) layer. Such a conductive region is typically referred to as a backplate. A conductive electrical contact is provided to the backplate, typically by a contact via that extends from a top surface of an SOI substrate to the backplate. An appropriate voltage potential can be applied to the backplate through the contact via to alter the characteristics of SOI devices and circuits above the BOX layer. The backplate is externally biased, i.e., is not a floating node.

For example, in the case of fully-depleted SOI CMOS circuits, it is desirable to tune the threshold voltages of n-type field effect transistor (nFET) devices and p-type field effect transistor (pFET) devices to achieve substantially the same magnitude. Such adjustments can provide a balance between the nFET and pFET drive currents, which leads to improved device performance and circuit speed. A negative voltage applied to the backplate can be used to simultaneously increase the threshold voltage of the nFET and reduce the threshold voltage of the pFET. Alternatively, a positive voltage applied to the backplate can be used to simultaneously increase the threshold voltage of the pFET and reduce the threshold voltage of the nFET.

In the case of CMOS devices, the device characteristics can be influenced by electrical charges trapped in the BOX if the density of the trapped electrical charge is sufficiently high. Trapped electrical charge in the BOX layer can be the result of a CMOS chip fabrication process. For example, irradiative processes or high-ion-energy processes, such as reactive-ion etching or plasma deposition, can result in electrical charges trapped in the BOX layer. The effect of undesirable electrical charges trapped in the BOX layer can be "neutralized" by applying a bias voltage to a backplate located on the backside of the BOX layer. Thus, a positive backplate voltage can be used to neutralize the effect of negative charge in the BOX and a negative backplate voltage can be used to neutralize the effect of positive charge in the BOX.

Backplates employed in known structures for SOI devices and circuits are hard-wired backplates, i.e., non-floating backplates that are not electrically isolated from other structures. Such hard-wired backplates are electrically biased through an electrically conductive path that includes a contact structure through a BOX layer. Each backplate has an electrical wire connection, and the plate voltage is applied via the wire connection.

BRIEF SUMMARY

According to an embodiment of the present invention, SOI CMOS structures having at least one programmable electrically floating backplate are provided. Each electrically floating backplate is individually programmable. Programming can be performed by injecting electrons into each conductive floating backplate. Erasure of the programming can be accomplished by tunneling the electrons out of the floating backplate.

Compared with the regular hard-wired (non-floating) backplate schemes, programmable floating backplates provide more versatile functions. For example, with hard-wired backplates, it is cumbersome to have adjacent backplates electrically biased at different voltages. With electrically floating backplates, each backplate can be programmed to its desired voltage without electrical circuits dedicated to maintaining the electrical bias of adjacent backplates at different voltage potentials.

According to an aspect of the present invention, a semiconductor structure is provided, which includes a buried floating conductive material portion embedded in a substrate; a first buried insulator layer contacting a bottom surface of the buried floating conductive material portion; a second buried insulator layer contacting a top surface of the buried floating conductive material portion; a top semiconductor layer including a source region and a drain region of a p-type injector field effect transistor and source and drain regions of at least one field effect transistor; and a switchable voltage supply system configured to provide a voltage differential across the drain region and the source region of the p-type injector field effect transistor. The p-type injector field effect transistor is configured to generate hot electrons having sufficient energy to pass though the second buried insulator layer and to flow into the buried floating conductive material portion.

According to another aspect of the present invention, another semiconductor structure is provided, which includes a buried floating conductive material portion embedded in a substrate; a first buried insulator layer contacting a bottom surface of the buried floating conductive material portion; a second buried insulator layer contacting a top surface of the buried floating conductive material portion; a top semiconductor layer including an n-doped semiconductor region and source and drain regions of at least one field effect transistor; and a switchable voltage supply system configured to provide at least one voltage to the n-doped semiconductor region. The at least one voltage has a magnitude that is high enough to induce tunneling of electrons though the second buried insulator layer into or out of the buried floating conductive material portion.

According to yet another aspect of the present invention, a method of operating at least one field effect transistor is provided, which includes providing a semiconductor structure including a buried floating conductive material portion embedded in a substrate, a first buried insulator layer contacting a bottom surface of the buried floating conductive material portion, a second buried insulator layer contacting a top surface of the buried floating conductive material portion, a top semiconductor layer source and drain regions of at least one field effect transistor, and an injection means for injecting electrons through the second buried insulator layer; and injecting electrons from the injection means though the second buried insulator layer into the buried floating conductive material portion. Electrons accumulated in the buried floating conductive material portion alter a threshold voltage of the at least one field effect transistor.

DETAILED DESCRIPTION

As stated above, the present invention relates to semiconductor structures including semiconductor devices having a programmable floating backplate, methods of manufacturing the same, and methods of operating the same, which are now described with accompanying figures. Throughout the drawings, the same reference numerals or letters are used to designate like or equivalent elements. The drawings are not necessarily drawn to scale.

As used herein, an "injector field effect transistor" refers to a field effect transistor that is configured to inject hot electrons to neighboring structures during operation. An injector field effect transistor includes a gate dielectric that is thick enough to avoid structural damage to the gate dielectric during the operation.

As used herein, a "hot electron" is an electron that gains sufficient kinetic energy to overcome a potential barrier represented by the energy difference between the conduction-band edge of the semiconductor and the conduction-band edge of the insulator in a semiconductor-insulator system. Such a hot electron can pass into and through the insulator layer readily. A hot electron may be generated when electrons or holes travel in a high electric field region of a semiconductor material.

As used herein, a "trench isolation structure" is an isolation structure filling a contiguous trench and providing lateral electrical isolation between at least two elements that are separated by said trench isolation structure.

At least one of two means can accomplish programming of the electrically floating backplate. The two means include Fowler-Nordheim tunneling, and hot electron injection using an SOI p-type field effect transistor (pFET). Hot electron injection using an SOI pFET can be done at much lower voltage than injection by tunneling electron injection. For example, using an SOI pFET, the hot electron injection current can be about $2 \times 10^{-13}$ A per micron of the FET device width at a source-drain voltage of 4 V. To achieve a tunneling current density of $2 \times 10^{-13}$ A/$\mu m^2$, an electric field of about 8 MV/cm is needed. For a buried oxide layer of a stoichiometric silicon oxide having a thickness of 50 nm, this implies a tunneling voltage of 40 V across the buried oxide layer is needed to achieve $2 \times 10^{-13}$ A/$\mu m^2$.

Figure 1:
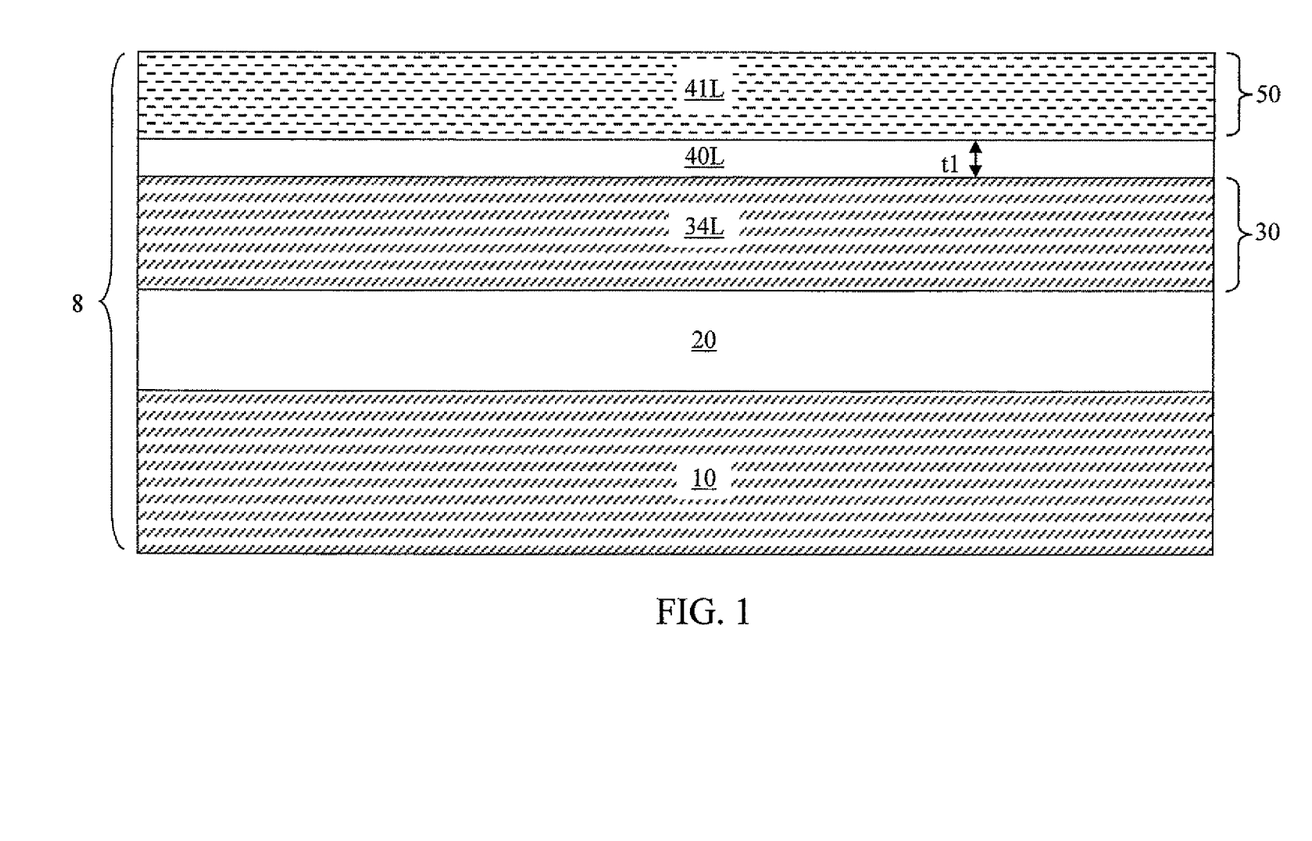
FIG. 1 is a vertical cross-sectional view of a first exemplary semiconductor structure before formation of at least one first trench isolation structure.

Referring to FIG. 1, a first exemplary semiconductor structure according to a first embodiment of the present invention includes a substrate 8. The substrate 8 includes, from bottom to top, a handle substrate 10, a first buried insulator layer 20, an unpatterned buried conductive material layer 34L, an unpatterned second buried insulator layer 40L, and an unpatterned top semiconductor layer 41L. The unpatterned buried conductive material layer 34L constitutes the entirety of a buried conductive layer 30, which refers to the entirety of the material above the top surface of the first buried insulator layer 20 and below the bottom surface of the unpatterned second buried insulator layer 40L at this step. The unpatterned top semiconductor layer 41L constitutes the entirety of a top semiconductor layer 50, which refers to the entirety of the material above the top surface of the unpatterned second buried insulator layer 40L at this step.

The handle substrate 10 can include a semiconductor material, an insulator material, or a metallic material. For example, the handle substrate 10 can be composed of a single crystalline semiconductor material such as silicon.

The first buried insulator layer 20 includes a dielectric material such as silicon oxide or silicon nitride, or a composite of silicon oxide and silicon nitride. The thickness of the first buried insulator layer 20 can be from 10 nm to 2,000 nm, and typically from 100 nm to 300 nm, although lesser and greater thicknesses can also be employed.

The unpatterned buried conductive material layer 34L includes a conductive material. The conductive material of the unpatterned buried conductive material layer 34L can be selected from, but is not limited to, metal, metal silicide, doped semiconductor, composite of metal and semiconductor, and composite of metal silicide and semiconductor. Preferably, the conductive material of the unpatterned buried conductive material layer 34L is a doped polycrystalline semiconductor such as doped polycrystalline silicon (polysilicon) or doped epitaxial semiconductor such as doped epitaxial silicon. The unpatterned buried conductive material layer 34L is not patterned, i.e., is a single contiguous layer that does not include any hole. The thickness of the unpatterned buried conductive material layer 34L, which is herein referred to as a first thickness t1, can be from 5 nm to 2,000 nm, and typically from 10 nm to 300 nm, although lesser and greater thicknesses can also be employed.

The unpatterned second buried insulator layer 40L includes a dielectric material such as silicon oxide. The thickness of the unpatterned second buried insulator layer 40L can be from 5 nm to 1,000 nm, and preferably from 10 nm to 200 nm, and more preferably from 10 nm to 50 nm, although lesser and greater thicknesses can also be employed. The unpatterned second buried insulator layer 40L is not patterned, i.e., is a single contiguous layer that does not include any hole.

The unpatterned top semiconductor layer 41L includes a semiconductor material. Any of the semiconductor materials that can be employed for the unpatterned buried conductive material layer 34L can be employed for the material of the unpatterned top semiconductor layer 41L. Preferably, the semiconductor material of the unpatterned top semiconductor layer 41L is a single crystalline semiconductor material having an epitaxial alignment among atoms within the entirety of the unpatterned top semiconductor layer 41L. For example, the semiconductor material of the unpatterned top semiconductor layer 41L can be single crystalline silicon. The unpatterned top semiconductor layer 41L can be composed of an intrinsic semiconductor material or a doped semiconductor material. The unpatterned top semiconductor layer 41L is not patterned, i.e., is a single contiguous layer that does not include any hole. The thickness of the unpatterned top semiconductor layer 41L can be from 5 nm to 2,000 nm, and typically from 10 nm to 300 nm, although lesser and greater thicknesses can also be employed.

Figure 2:
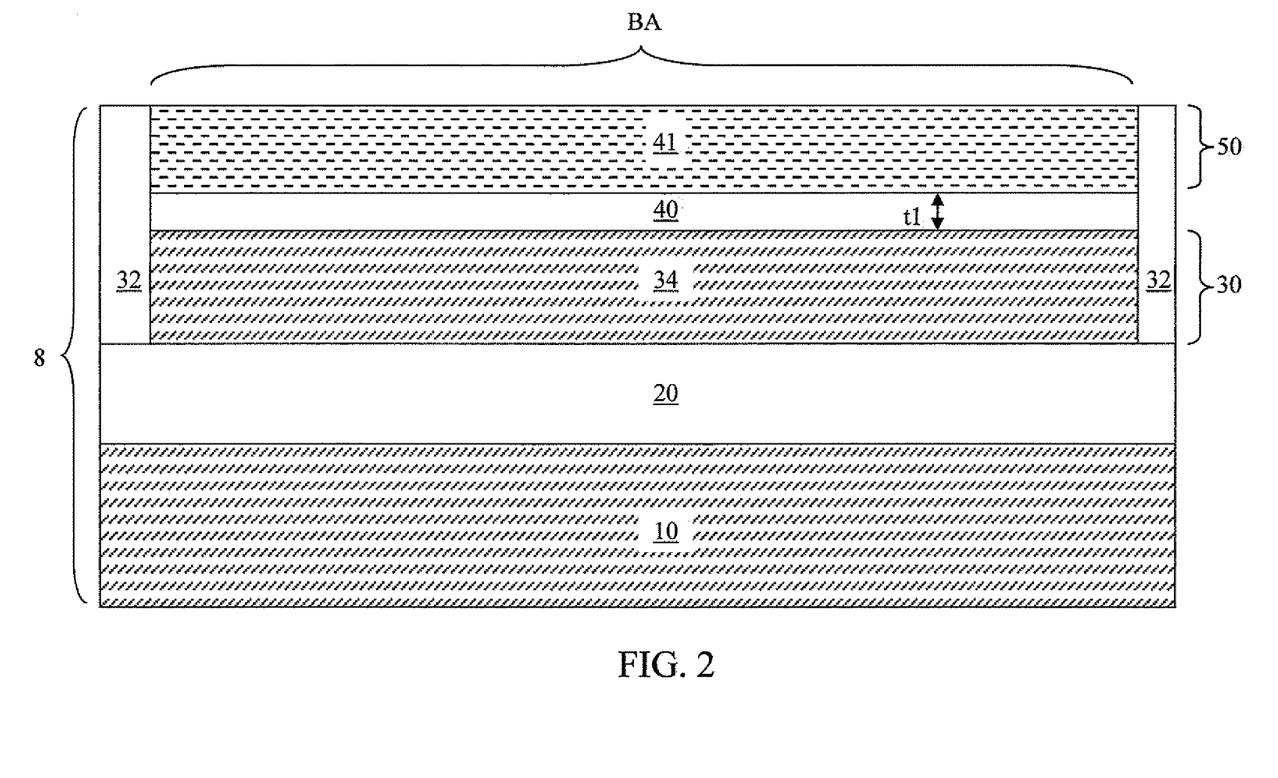
FIG. 2 is a vertical cross-sectional view of the first exemplary semiconductor structure after formation of at least one first trench isolation structure.

Referring to FIG. 2, at least one first trench isolation structure 32 is formed into the first exemplary semiconductor structure of FIG. 1 by lithographically patterning at least one trench around an area of the first exemplary semiconductor structure and filling the at least one trench with a dielectric material. The dielectric material can be silicon oxide, silicon oxynitride, silicon nitride, or a combination thereof. Alternately, the at least one trench can be filled with a combination of a dielectric liner that is deposited on sidewalls and bottom surfaces of the at least one trench and a fill material that subsequently fills the remaining portions of the at least one trench. In this case, the dielectric liner includes a dielectric material such as silicon oxide, silicon oxynitride, silicon nitride, or a combination thereof, and the fill material can be a semiconductor material such as polysilicon, a dielectric material, or a conductive material. An excess dielectric material and/or an excess fill material deposited above a top surface of the substrate 8 is removed by planarization such as chemical mechanical planarization (CMP), recess etch, or a combination thereof.

The area surrounded by the at least one first trench isolation structure 32 is herein referred to as a backplate area BA. The at least one trench laterally surrounds a vertical stack of a remaining portion of the unpatterned buried conductive material layer 34L (See FIG. 1) within the backplate area BA, a remaining portion of the unpatterned second buried insulator layer 40L (See FIG. 1) within the backplate area BA, and a remaining portion of the unpatterned top semiconductor layer 41L (See FIG. 1) within the backplate area BA. The remaining portion of the unpatterned buried conductive material layer 34L within the backplate area BA is herein referred to as a buried floating conductive material portion 34, i.e., a portion of a conductive material that is structurally buried and electrically floating. The remaining portion of the unpatterned second buried insulator layer 40L within the backplate area BA is herein referred to as a second buried insulator layer 40. The remaining portion of the unpatterned top semiconductor layer 41L within the backplate area BA is herein referred to as a prototype top semiconductor portion 41. The buried floating conductive material portion 34 is not contacted by any conductive structure.

The at least one trench extends at least to a top surface of the first buried insulator layer 20 upon formation. Consequently, the at least one first trench isolation structure 32 extends from the top surface of the prototype top semiconductor portion 41 at least to the top surface of the first buried dielectric layer 20. The sidewalls of the buried floating conductive material portion 34, the second buried insulator layer 40, and the prototype top semiconductor portion 41 can be vertically coincident, i.e., on a same periphery when viewed from above, and laterally contacts sidewalls of the at least one first trench isolation structure 32. The at least one first trench isolation structure 32 laterally surrounds the vertical stack of the buried floating conductive material portion 34, the second buried insulator layer 40, and the prototype top semiconductor portion 41.

The buried floating conductive material portion 34 and lower portions of the at least one first trench isolation structure 32 constitute the buried conductive layer 30, which refers to the entirety of the material above the top surface of the first buried insulator layer 20 and below the bottom surface of the second buried insulator layer 40 at this step. The prototype top semiconductor portion 41 and upper portions of the at least one first trench isolation structure 32 constitute the top semiconductor layer 50, which refers to the entirety of the material above the top surface of the second buried insulator layer 40 at this step.

Figure 3:
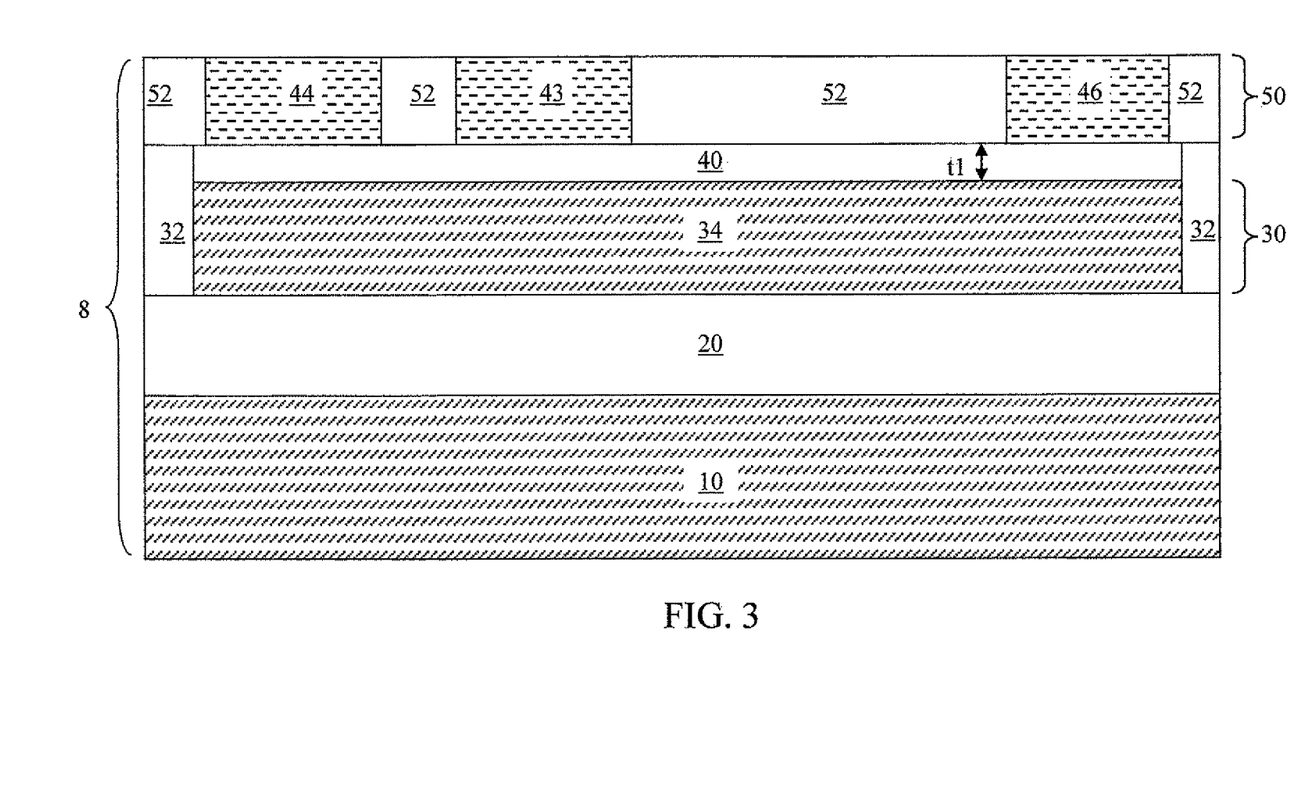
FIG. 3 is a vertical cross-sectional structure of the first exemplary semiconductor structure after formation of at least one second trench isolation structure.

Referring to FIG. 3, of at least one second trench isolation structure 52 is formed by lithographically patterning at least one shallow trench in the top semiconductor layer and filling the at least one shallow trench with a dielectric material. Preferably, the at least one shallow trench extends from the top surface of the substrate 8, i.e., the top surface of the top semiconductor layer 50, to a depth between the top surface of the second buried insulator layer 40 and the bottom surface of the second buried insulator layer 40. The dielectric material can be silicon oxide, silicon oxynitride, silicon nitride, or a combination thereof. An excess dielectric material deposited above the top surface of the substrate 8 is removed by planarization such as chemical mechanical planarization (CMP), recess etch, or a combination thereof.

The at least one second trench isolation structure 52 laterally encloses a plurality of top semiconductor portions, which include an injection device semiconductor portion 46, at least one p-type device semiconductor portion 43, and at least one n-type device semiconductor portion 44. The injection device semiconductor portion 46 is a semiconductor portion in which an electron injection device is subsequently formed. The at least one p-type device semiconductor portion 43 is at least one semiconductor portion in which at least one p-type field effect transistor is subsequently formed. The at least one n-type device semiconductor portion 44 is at least one semiconductor portion in which at least one n-type field effect transistor is subsequently formed. The injection device semiconductor portion 46, the at least one p-type device semiconductor portion 43, and the at least one n-type device semiconductor portion 44 overlie the buried floating conductive material portion 34.

Preferably, the injection device semiconductor portion 46 is spaced from the at least one p-type device semiconductor portion 43 and the at least one n-type device semiconductor portion 44 by a sufficient lateral distance to prevent tunneling of electrons between the injection device semiconductor portion 46 and any of the at least one p-type device semiconductor portion 43 and the at least one n-type device semiconductor portion 44. Consequently, the lateral separation distances between the injection device semiconductor portion 46 and any of the at least one p-type device semiconductor portion 43 and the at least one n-type device semiconductor portion 44 is greater than the first thickness t1.

The sidewalls of the injection device semiconductor portion 46, the at least one p-type device semiconductor portion 43, and the at least one n-type device semiconductor portion 44 laterally contact the at least one second trench isolation structure 52. The bottom surfaces of the injection device semiconductor portion 46, the at least one p-type device semiconductor portion 43, and the at least one n-type device semiconductor portion 44 vertically contact the second buried insulator layer 40.

Figure 4:
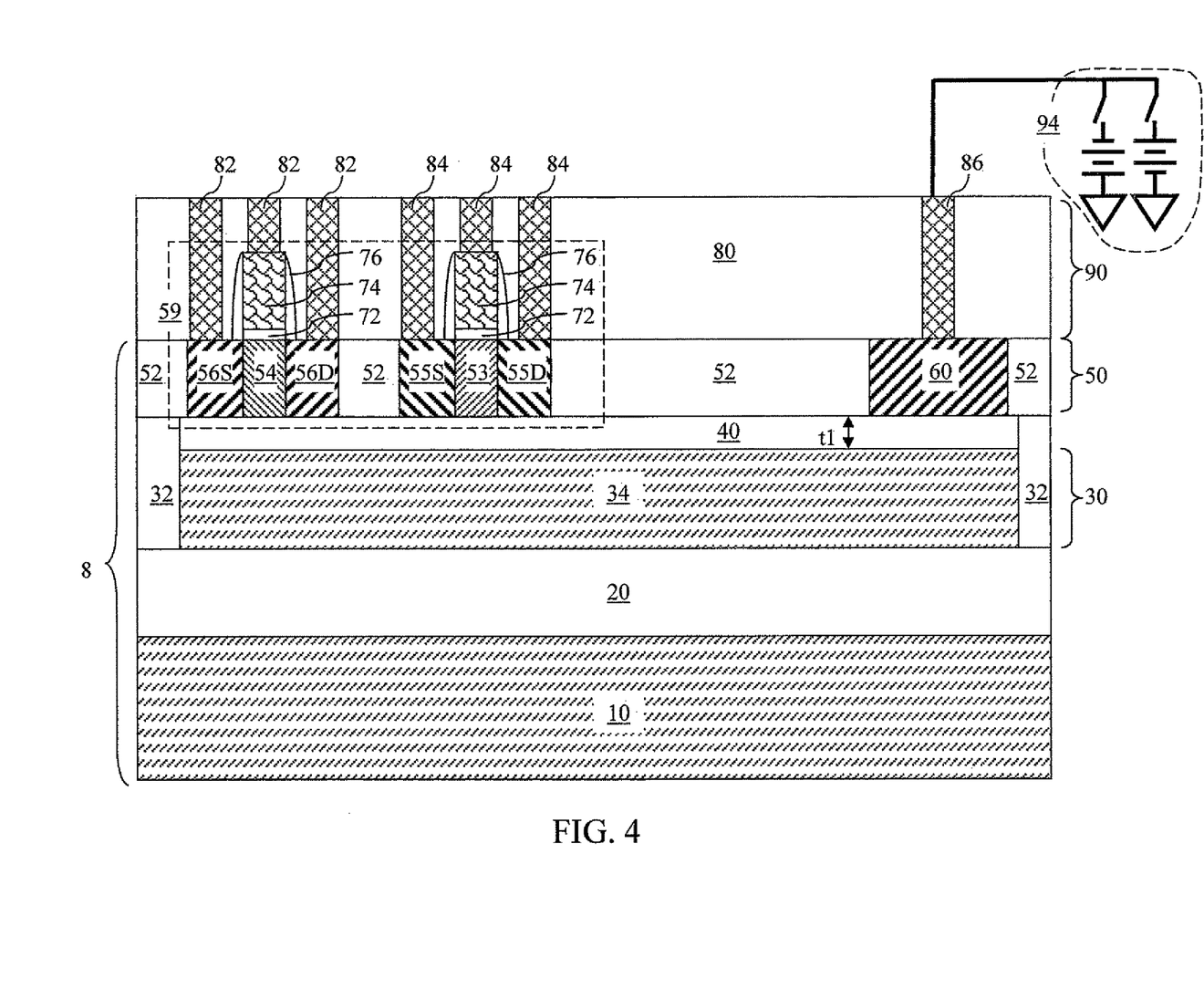
FIG. 4 is a vertical cross-sectional structure of the first exemplary semiconductor structure after formation of an n-doped semiconductor region.

Referring to FIG. 4, an n-doped semiconductor region 60 is formed in the top semiconductor layer 50 by implanting n-type dopants into the injection device semiconductor portion 46. The n-doped semiconductor region 60 is an injection means, i.e., an injection device that can be employed to inject electrons into the buried floating conductive material portion 34 or to extract electrons out of the buried floating conductive material portion 34 through the second buried insulator layer 40. The injection and extraction of electrons can be effected by applying a voltage bias to the n-doped semiconductor region 60. While a p-doped semiconductor region (not shown) can be substituted for the n-doped semiconductor region 60, the n-doped semiconductor region 60 is preferred over a p-doped semiconductor region because the n-doped semiconductor region 60 generates electrons more efficiently for injection into the buried floating conductive material portion 34.

At least one p-type field effect transistor can be formed in the area of the at least one p-type device semiconductor portion 43, and at least one n-type field effect transistor can be formed in the area of the at least one n-type device semiconductor portion 44. For example, a gate stack including a gate dielectric 72 and a gate electrode 74 is formed for each field effect transistor.

Dopant ions are implanted into portions of the at least one p-type device semiconductor portion 43 and/or portions of the at least one n-type device semiconductor portion 44 employing any gate stack (72, 74) as a self-aligning implantation mask in the area of the implantation. Dielectric gate spacers 76 can be employed to adjust the offset between edges of the gate dielectric(s) 72 and ion-implanted areas. The ion-implanted areas include a p-doped source region 55S and a p-doped drain region 55D for each p-type field effect transistor and an n-doped source region 56S and an n-doped drain region 56D for each n-type field effect transistor. An unimplanted remaining portion of the at least one p-type device semiconductor portion 43 (See FIG. 3) masked by a gate stack (72. 74) constitutes a body region 53, and an unimplanted remaining portion of the at least one n-type device semiconductor portion 44 (See FIG. 3) masked by another gate stack (72, 74) constitutes a body region 54.

The set of the at least one p-type field effect transistor and/or the at least one n-type field effect transistor that overlie the buried floating conductive material portion 34 are collectively referred to as at least one semiconductor-on-insulator (SOI) device 59. The at least one semiconductor-on-insulator (SOI) device 59 can be at least one field effect transistor including at least one fully depleted field effect transistor, which has a source region and a drain region that contact the second buried insulator layer 40. The buried floating conductive material portion 34 functions as a backplate that applies a bias voltage that affects the device characteristics of the at least one semiconductor-on-insulator (SOI) device 59.

The device characteristics of the at least one p-type field effect transistor and/or the at least one n-type field effect transistor are altered by the electrical potential of the buried floating conductive material portion 34. The electrical potential of the buried floating conductive material portion 34 can be altered by a change in the quantity of electrical charges trapped inside the buried floating conductive material portion 34. While the present invention illustrates a p-type field effect transistor and an n-type field effect transistor, the at least one semiconductor-on-insulator (SOI) device 59 can include any semiconductor device of which device characteristics can be altered by the quantity of the electrical charges trapped in the buried floating conductive material portion 34.

Semiconductor devices (not shown) configured to control the voltage applied to the n-doped semiconductor region 60 can be formed on the substrate 8 by methods known in the art. The semiconductor devices can include structures that function as a switchable voltage supply system 94. Preferably, the switchable voltage supply system 94 includes first switchable voltage supply system components configured to provide a negative voltage to the n-doped semiconductor region 60 and second switchable voltage supply system components configured to provide a positive voltage to the to the n-doped semiconductor region 60.

After formation of the at least one semiconductor-on-insulator (SOI) device 59, the n-doped semiconductor region 60, and semiconductor devices configured to control the voltage applied to the n-doped semiconductor region 60, a dielectric material layer 80 is formed over the substrate 8. Contact via structures are formed in the dielectric material layer 80 to provide electrical contact to the various components of the at least one semiconductor-on-insulator (SOI) device 59 and the n-doped semiconductor region 60. For example, the contact via structures can include an n-doped semiconductor region contact via 86, p-doped field effect transistor contact vias 84, and n-doped field effect transistor contact vias 82, which provide electrical contact to the n-doped semiconductor region 60, the at least one p-type field effect transistor, and the at least one n-type field effect transistor, respectively. The n-doped semiconductor region contact via 86 is conductively connected to the semiconductor devices configured to control the voltage applied to the n-doped semiconductor region 60 through metal interconnect structures, which are schematically shown as a line between the n-doped semiconductor region contact via 86 and the switchable voltage supply system 94.

The switchable voltage supply system 94 is configured to provide at least one voltage to the n-doped semiconductor region 60. The at least one voltage has a magnitude that is high enough to induce tunneling of electrons though the second buried insulator layer 40 into or out of the buried floating conductive material portion 34. Preferably, the at least one voltage includes a negative voltage that induces tunneling of electrons though the second buried insulator layer 40 into the buried floating conductive material portion 34 and a positive voltage that induces tunneling of electrons though the second buried insulator layer 40 out of the buried floating conductive material portion 34. The magnitude of the negative voltage is high enough to enable tunneling of electrons through the second buried insulator layer 40. Likewise, the magnitude of the positive voltage is high enough to enable tunneling of electrons through the second buried insulator layer 40.

The buried floating conductive material portion 34 is encapsulated by the first buried insulator layer 20, the second buried insulator layer 40, and at least one first trench isolation structure 32 that laterally surrounds and encloses the buried floating conductive material portion 34. Due to the encapsulation by a dielectric material, the buried floating conductive material portion 34 retains electrical charges accumulated therein after the voltage bias at the n-doped semiconductor region 60 is turned off. Since the electrical charges are retained in the buried floating conductive material portion 34, the device characteristics of the at least one semiconductor-on-insulator (SOI) device 59 are altered as long as the electrical charges remain in the buried floating conductive material portion 34. Electrical charges can be removed from the buried floating conductive material portion 34 by tunneling through the second buried insulator layer 40 into the n-doped semiconductor region 60 when a positive voltage is applied to the n-doped semiconductor region 60. If the switchable voltage supply system 94 is configured to provide more than two bias voltages, the amount of electrical charges in the buried floating conductive material portion 34 can be at any level corresponding to the last applied voltage to the n-doped semiconductor region 60.

In case the at least one semiconductor-on-insulator (SOI) device 59 includes at least one field effect transistor, which is a semiconductor-on-insulator (SOI) transistor due to the presence of the second buried insulator layer 40 underneath, electrons accumulated in the buried floating conductive material portion 34 alter a threshold voltage of the at least one field effect transistor. When a negative voltage is applied to the n-doped semiconductor region 60 located in the top semiconductor layer 50, the buried floating conductive material portion 34 is programmed to a state that includes accumulated electrons therein as electrons tunnel from the n-doped semiconductor region 60 through the second buried insulator layer 40 into the buried floating conductive material portion 34. When a positive voltage is applied to the n-doped semiconductor region 60, electrons are removed from the buried floating conductive material portion 34 by tunneling from the buried floating conductive material portion 34 through the second buried insulator layer 40 into the n-doped semiconductor region 60.

As an illustrative example, a set of operating parameters for the positive and negative voltages applied to the n-doped semiconductor region 60 is provided herein. If the first thickness t1 of the second buried insulator layer 40 is 10 nm, a negative voltage of −10V applied to the n-doped semiconductor region 60 generates an electric field strength of $10^7$ V/cm in the portion of the second buried insulator layer 40 between the n-doped semiconductor region 60 and the buried floating conductive material portion 34 when the voltage of the buried floating conductive material portion 34 is zero, i.e., when there is no electrical charge in the buried floating conductive material portion 34. Electrons tunnel through the second buried insulator layer 40 into the buried floating conductive material portion 34 until the voltage of the buried floating conductive material portion 34 rises to a level that reduces the electric field strength to disable the tunneling. Thus, the amount of the electrical charge trapped in the buried floating conductive material portion 34 and the voltage of the buried floating conductive material portion 34 upon programming is self-limiting for a given bias voltage applied to the n-doped semiconductor region 60. The electrons can remain trapped in the buried floating conductive material portion 34 even after the applied negative voltage at the n-doped semiconductor region 60 is turned off, thereby enabling maintenance of a negative voltage at the buried floating conductive material portion 34. Thus, the buried floating conductive material portion 34 remains programmed.

To unprogram the buried floating conductive material portion 34, a positive voltage is applied to the n-doped semiconductor region 60. If the first thickness t1 of the second buried insulator layer 40 is 10 nm, a positive voltage of 10V applied to the n-doped semiconductor region 60 generates an electric field strength greater than $10^7$ V/cm in the portion of the second buried insulator layer 40 between the n-doped semiconductor region 60 and the buried floating conductive material portion 34 because the voltage of the buried floating conductive material portion 34 is negative. Electrons tunnel out of the buried floating conductive material portion 34 into the n-doped semiconductor region 60 through the second buried insulator layer 40 until the voltage of the buried floating conductive material portion 34 rises to a level that reduces the electric field strength to disable the tunneling.

In one embodiment, the magnitude of the positive voltage applied to the n-doped semiconductor region 60 during erasure of the programming can be adjusted so that the tunneling of the electrons stop when the voltage at the buried floating conductive material portion 34 is close to 0V. Alternately, the magnitude of the positive voltage applied to the n-doped semiconductor region 60 during erasure of the programming can be adjusted so that the tunneling of the electrons stop when the voltage at the buried floating conductive material portion 34 is at a predefined positive voltage or at a predefined negative voltage.

The amount of the electrical charge trapped in the buried floating conductive material portion 34 and the voltage of the buried floating conductive material portion 34 is typically self-limiting for a given bias voltage applied to the n-doped semiconductor region 60.

A critical electrical field strength on the order of 8 MV/cm is typically required to enable electron tunneling through stoichiometric silicon oxide without defects. The magnitude of the critical electrical field strength varies depending on the composition of the second buried insulator layer 40. For example, a silicon-rich silicon oxide can have a critical electrical field strength of about one half of the critical electrical field strength of a normal silicon oxide. In one embodiment of the present invention, the second buried insulator layer 40 employs a silicon-rich silicon oxide in which the composition of the silicon-rich silicon oxide is $SiO_x$ such that x is less than 2.

The first embodiment employs Fowler-Nordheim tunneling for injection of electrons from the n-doped semiconductor region 60 into the buried floating conductive material portion 34 and for extraction of electrons from the buried floating conductive material portion 34 into the n-doped semiconductor region 60.

Figure 5:
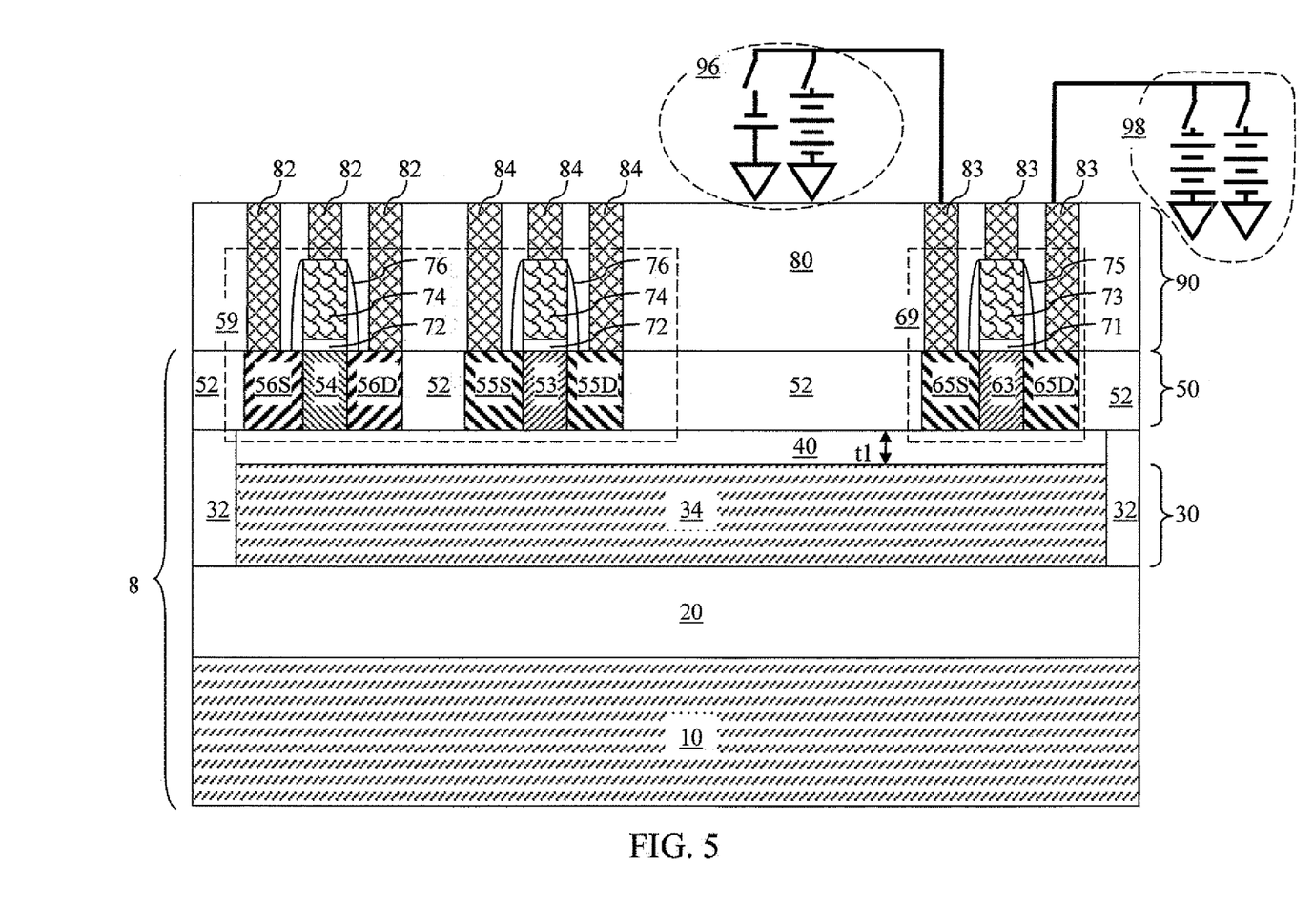
FIG. 5 is a vertical cross-sectional structure of a second exemplary semiconductor structure.

Referring to FIG. 5, a second exemplary semiconductor structure according to a second embodiment of the present invention is derived from the first exemplary semiconductor structure of the first embodiment by substituting an injector field effect transistor (FET) 69 for an n-doped semiconductor region 60 (See FIG. 4) as an injection means. The injector FET 69 is a p-type filed effect transistor that includes an injector FET gate dielectric 71, an injector FET gate electrode 73, an injector FET source region 65S, an injector FET drain region 65D, an injector FET body region 63, and an injector FET dielectric spacer 75. The injector FET source region 65S and the injector FET drain region 65D are doped with p-type dopants, and the injector FET body region 63 is doped with n-type dopants. Injector FET contact vias 83 are formed to provide electrical contacts to the various components of the injector FET 69. The injector FET 69 is an injection means that can inject electrons into the buried floating conductive material portion 34.

A switchable voltage supply system provides bias voltages to the various components of the injector FET 69. The switchable voltage supply system is configured to provide a voltage differential across the injector FET drain region 65D and the injector FET source region 65S. The injector FET 69 is configured to generate hot electrons having sufficient energy to pass though the second buried insulator layer 40 and to flow into the buried floating conductive material portion 34.

The switchable voltage supply system can include a source-side switchable voltage supply system 96 that is configured to provide at least two bias voltages to the injector FET source region 65S, a drain-side switchable voltage supply system 98 that is configured to provide at least two bias voltages to the injector FET drain region 65D, and a gate-side switchable voltage supply system (not shown) configured to control the voltage bias applied to the injector FET gate electrode 73.

During programming of the buried floating conductive material region 34, the injector FET 69 is operated to generate hot electrons at the injector PET drain region 65D. The generation of the hot electrons can be effected by increasing the magnitude of the bias voltage between the injector PET source region 65S and the injector FET drain region 65D. The injector FET drain region 65D is held at a negative voltage relative to the injector PET source region 65S. Preferably, the thickness of the injector FET gate dielectric 71 is sufficiently thick to withstand the hot electrons scattered toward the injector FET gate electrode 75. The generation of the hot electrons at the injector FET drain region 65D accelerates the supply of electrons for injection into the buried floating conductive material region 34 relative to the generation of elections from an n-doped semiconductor region 60 in the first exemplary semiconductor structure of the first embodiment.

The hot electrons generated in the injector FET 69 pass through the second buried insulator layer 40 into the buried floating conductive material region 34 to program the buried floating conductive material portion 34. Upon programming, electrons are trapped in the buried floating conductive material region 34, and the potential of the buried floating conductive material region 34 is held at a negative voltage as a result of the trapped electrons. The electric field generated by the electrical charges in the buried floating conductive material region 34 alters device characteristics of the at least one semiconductor-on-insulator (SOI) device 59. The programming of the buried floating conductive material region 34 can be maintained after the injector FET 69 is turned off. The injector FET source region 65S and the injector FET drain region 65D can be grounded or electrically floating when the injector FET 69 is turned off.

The erasure of the programming can be effected by applying a positive voltage bias to the injector FET 69. For example, the injector FET source region 65S and the injector FET drain region 65D can be held at a positive voltage that is sufficiently high to induce the tunneling of electrons from the buried floating conductive material region 34 through the second buried insulator layer 40 into the injector FET 69.

The switchable voltage supply system (96, 98) is typically configured to provide at least one voltage to the injector FET 69. The at least one voltage is selected to include a voltage having a magnitude that is high enough to induce tunneling of electrons though the second buried insulator layer 40 into or out of the buried floating conductive material portion 34. The voltage applied to the injector FET drain region 65D during programming can be lower in magnitude than the voltage applied to an n-doped semiconductor region (See FIG. 4) during programming of the first exemplary semiconductor structure because the hot electrons have a high kinetic energy and can pass through the second buried insulator layer 40 more easily than electrons that do not have a high kinetic energy. The voltage applied to the injector FET drain region 65D during programming is a negative voltage. The magnitude of the negative voltage is high enough to enable passing of the hot electrons through the second buried insulator layer 40. Typically, the voltage having a magnitude high enough to induce tunneling out of the buried floating conductive material portion 34 is the voltage applied to the injector FET source region 65S and the injector FET drain region 65D, which can be biased at the same voltage during erasure of the programming. The voltage applied to the injector FET source region 65S and the injector FET drain region 65D can be a positive voltage. Likewise, the magnitude of the positive voltage is high enough to enable tunneling of electrons through the second buried insulator layer 40.

The buried floating conductive material portion 34 is encapsulated by the first buried insulator layer 20, the second buried insulator layer 40, and at least one first trench isolation structure 32 that laterally surrounds and encloses the buried floating conductive material portion 34 as in the first embodiment. Due to the encapsulation by a dielectric material, the buried floating conductive material portion 34 retains electrical charges accumulated therein after the voltage bias at the injector FET 69 is turned off. Since the electrical charges are retained in the buried floating conductive material portion 34, the device characteristics of the at least one semiconductor-on-insulator (SOI) device 59 are altered as long as the electrical charges remain in the buried floating conductive material portion 34. If the switchable voltage system (96, 98) is configured to provide more than two bias voltages, the amount of electrical charge in the buried conductive material portion 34 can be at any level corresponding to the maximum voltage across the injector FET source region 65S and the injector FET drain region 65D during the programming process.

In case the at least one semiconductor-on-insulator (SOI) device 59 includes at least one field effect transistor, which is a semiconductor-on-insulator (SOI) transistor due to the presence of the second buried insulator layer 40 therebeneath, electrons accumulated in the buried floating conductive material portion 34 alter a threshold voltage of the at least one field effect transistor as in the first embodiment. When a negative voltage is applied to the injector FET 69 located in the top semiconductor layer 50 to generate hot electrons, the buried floating conductive material portion 34 is programmed to a state that includes accumulated electrons therein as hot electrons pass from the injector FET 69 through the second buried insulator layer 40 into the buried floating conductive material portion 34. When a positive voltage is applied to the injector FET 69, electrons are removed from the buried floating conductive material portion 34 by tunneling from the buried floating conductive material portion 34 through the second buried insulator layer 40 into the injector FET 69.

The magnitude of the critical electrical field strength for removing electrons from the buried conductive material portion 34 by tunneling varies depending on the composition of the second buried insulator layer 40 as in the first embodiment. Thus, a silicon-rich silicon oxide can be employed for the second buried dielectric layer 40 as in the first embodiment.

The second embodiment employs hot electron injection from the injector FET 69 for injection of electrons into the buried floating conductive material portion 34. The second embodiment employs Fowler-Nordheim tunneling into the injector FET 69 for extraction of electrons from the buried floating conductive material portion 34.

Figure 6:
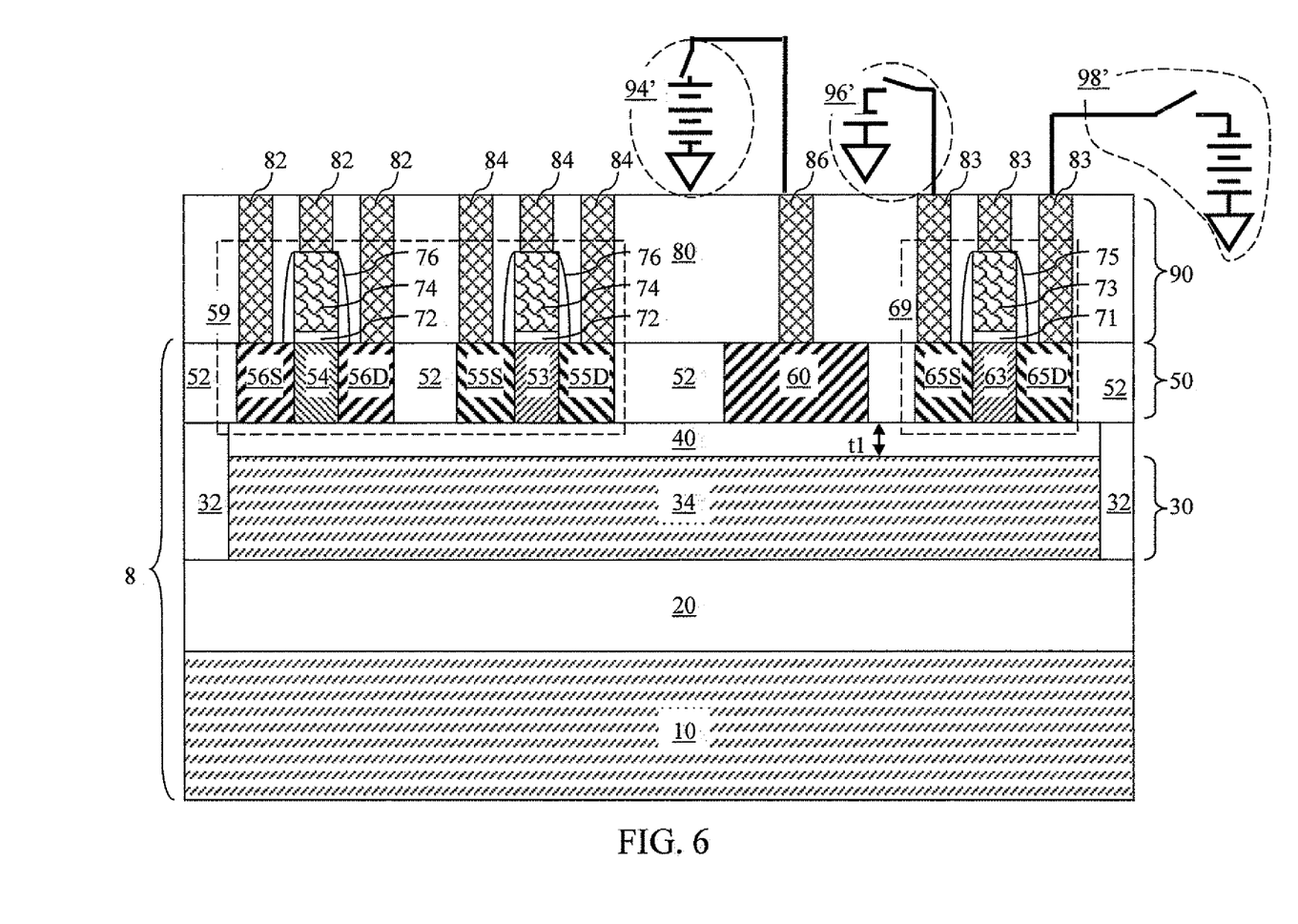
FIG. 6 is a vertical cross-sectional structure of a third exemplary semiconductor structure.

Referring to FIG. 6, a third exemplary semiconductor structure according to a third embodiment of the present invention is derived from the first and second exemplary semiconductor structures by forming an n-doped semiconductor region 60 of the first exemplary semiconductor structure and an injector FET 69 of the second exemplary semiconductor structure in or on the first semiconductor layer 50.

In the third embodiment, the injector FET 69 is employed to program the buried floating conductive material portion 34 by utilizing hot electrons generated from the injector 69 and to subsequently erase the programming of the buried floating conductive material portion 34 by extracting electrons from the buried floating conductive material portion 34 to the n-doped semiconductor region 60.

The switchable power supply system is modified to enable generation of hot electrons in the injection FET 69 and extraction of electrons at the n-doped semiconductor region 60. For example, the switchable power supply system can include a first switchable voltage supply system 94' that is identical to the switchable voltage supply system 94 of the first embodiment, a source-side switchable voltage supply system 96' which enables application of a negative voltage to the injector FET source region 65S, and a drain-side switchable voltage supply system 98' which enables application of a more negative voltage to the injector FET drain region 65D.

For programming of the buried floating conductive material portion 34, the injector FET 69 is employed to generate hot electrons that pass through the second buried insulator layer 40 into the buried floating conductive material portion 34. The capability of the injector FET 69 to generate hot electrons accelerates the programming process because more electrons become available at a low bias voltage. For erasure of the programming, the n-doped semiconductor region 60 is employed to extract the electrons from the buried floating conductive material portion 34 through tunneling through the second buried insulator layer 40. The n-type doping of the n-doped semiconductor region 60 in the top semiconductor layer 50 enhances the tunneling rate of the electrons through the second buried insulator layer 40 because less voltage is required for tunneling into the n-doped semiconductor region 60 than tunneling into a p-doped semiconductor region.

The third embodiment employs hot electron injection from the injector FET 69 for injection of electrons into the buried floating conductive material portion 34. The third embodiment employs Fowler-Nordheim tunneling into the n-doped semiconductor region 60 for extraction of electrons from the buried floating conductive material portion 34.

Figure 7:
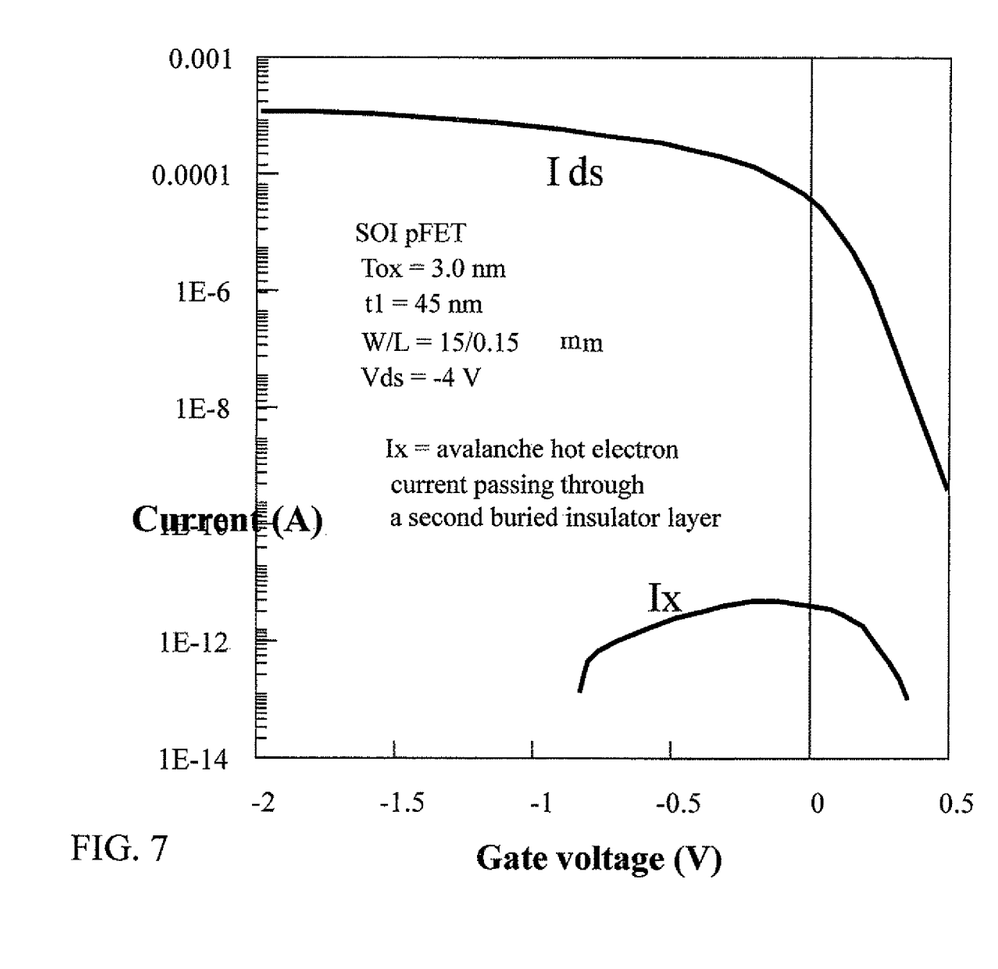
FIG. 7 is a graph showing measured values of a drain-to-source current and a hot electron injection current from a p-type field effect transistor according to an embodiment of the present invention.

Referring to FIG. 7, a graph is provided showing measured values of a drain-to-source current and a hot electron injection current from a p-type field effect transistor according to an embodiment of the present invention. The specifications of the p-type field effect transistor are shown as legends in the graph. The p-type field effect transistor can be employed as an injector FET 69 in the second or third exemplary semiconductor structure. Tox refers to the thickness of the injector FET gate dielectric 71. The first thickness t1 is the thickness of the second buried insulator layer 40, which is 45 nm in this case. The width of the channel is 15 μm, and the length of the channel is 0.15 μm. The injector FET drain region 65D is held at a voltage that is 4 V lower than the voltage at the injector FET source region 65S. The gate voltage is the voltage at the gate electrode of the p-type field effect transistor relative to the voltage at the source region of the p-type field effect transistor. Ids stands for the drain-to-source current, and Ix stands for the hot electron injection current, which is generated at the injector FET drain region 65D and flows through the second buried insulator layer 40 and into a buried floating conductive material portion 34.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
   a buried floating conductive material portion embedded in a substrate, wherein said buried floating conductive material portion has a constant thickness expanding an entire length thereof;
   a first buried insulator layer contacting a bottom surface of said buried floating conductive material portion;
   a second buried insulator layer contacting a top surface of said buried floating conductive material portion, wherein said second buried insulator layer has sidewall surfaces that are vertically coincident with sidewall surfaces of said buried floating conductive material portion, wherein said second buried insulator layer does not contact said first buried insulator layer, and wherein said buried floating conductive material portion is located between said first buried insulator layer and said second buried insulator layer;
   a top semiconductor layer contacting a top surface of said second buried insulator layer and including a source region and a drain region of a p-type injector field effect transistor and source and drain regions of at least one field effect transistor; and
   a switchable voltage supply system configured to provide a voltage differential across said drain region and said source region of said p-type injector field effect transistor,
   wherein said p-type injector field effect transistor is configured to generate hot electrons having sufficient energy to pass through said second buried insulator layer and to flow into said buried floating conductive material portion and to extract electrons from the said buried floating conductive material portion by tunneling the electrons through said second buried insulator layer into said p-type injector field effect transistor.

2. The semiconductor structure of claim 1, wherein said source region and said drain region of said p-type injector field effect transistor and said source and drain regions of said at least one field effect transistor overlie said buried floating conductive material portion.

3. The semiconductor structure of claim 1, wherein said second buried insulator layer is a silicon oxide layer having a thickness from 5 nm to 1,000 nm.

4. The semiconductor structure of claim 3, wherein said second buried insulator layer has a thickness from 10 nm to 200 nm.

5. The semiconductor structure of claim 1, wherein said at least one field effect transistor includes at least one p-type field effect transistor and at least one n-type field effect transistor.

6. The semiconductor structure of claim 1, wherein said buried floating conductive material portion is not contacted by any conductive structure.

7. The semiconductor structure of claim 1, wherein said at least one field effect transistor includes at least one fully depleted field effect transistor having a source region and a drain region that contact said second buried insulator layer.

8. A semiconductor structure comprising:
   a buried floating conductive material portion embedded in a substrate, wherein said buried floating conductive material portion has a constant thickness expanding an entire length thereof;
   a first buried insulator layer contacting a bottom surface of said buried floating conductive material portion;
   a second buried insulator layer contacting a top surface of said buried floating conductive material portion, wherein said second buried insulator layer has sidewall surfaces that are vertically coincident with sidewall surfaces of said buried floating conductive material portion, wherein said second buried insulator layer does not contact said first buried insulator layer, and wherein said buried floating conductive material portion is located between said first buried insulator layer and said second buried insulator layer;
   a top semiconductor layer contacting a top surface of said second buried insulator layer and including a source region and a drain region of a p-type injector field effect transistor, an n-doped semiconductor region and source and drain regions of at least one field effect transistor; and
   a switchable voltage supply system configured to provide a first voltage to said p-type injector field effect transistor and a second voltage to said n-doped semiconductor region, wherein said p-type injector field effect transistor is configured to generate hot electrons having sufficient energy to pass through said second buried insulator layer and to flow into said buried floating conductive material portion under said first voltage, and wherein said n-doped semiconductor region is configured to extract electrons from said buried floating conductive material portion by tunneling said electrons into said n-doped semiconductor region through said second buried insulator layer under said second voltage.

9. The semiconductor structure of claim 8, further comprising:
- an n-doped semiconductor region contact via that contacts a portion of an upper surface of said n-doped semiconductor region; and
- a dielectric material layer embedding said n-doped semiconductor region contact via and contacting another portion of said upper surface of said n-doped semiconductor region.

10. The semiconductor structure of claim 9, wherein said source region and said drain region of said p-type injector field effect transistor, said n-doped semiconductor region and said source and drain regions of said at least one field effect transistor overlie said buried floating conductive material portion.

11. The semiconductor structure of claim 9, further comprising:
- at least one trench isolation structure that laterally surrounds and encloses said buried floating conductive material portion; and
- at least one second trench isolation structure that laterally surrounds and encloses said n-doped semiconductor region, wherein said n-doped semiconductor region contacts an upper surface of said second buried insulator layer.

12. The semiconductor structure of claim 11, wherein said buried floating conductive material portion is encapsulated by said first buried insulator layer, said second buried insulator layer, and at least one trench isolation structure that laterally surrounds and encloses said buried floating conductive material portion.

* * * * *